(12) United States Patent
Chen

(10) Patent No.: US 6,310,365 B1
(45) Date of Patent: Oct. 30, 2001

(54) SURFACE VOLTAGE SUSTAINING STRUCTURE FOR SEMICONDUCTOR DEVICES HAVING FLOATING VOLTAGE TERMINAL

(75) Inventor: Xingbi Chen, Chengdu (CN)

(73) Assignee: University of Electronic Science and Technology (CN)

( * ) Notice: Subject to any disclaimer, the term of this patent is extended or adjusted under 35 U.S.C. 154(b) by 0 days.

(21) Appl. No.: 09/414,707

(22) Filed: Oct. 8, 1999

(51) Int. Cl.[7] .......................... H01L 29/74; H01L 31/111
(52) U.S. Cl. .................... 257/111; 257/285; 257/367; 257/368; 257/369
(58) Field of Search ........................... 257/285, 369, 257/368, 111, 367

(56) References Cited

U.S. PATENT DOCUMENTS

| | | | |
|---|---|---|---|
| 5,240,865 | * | 8/1993 | Malhi ........................................ 437/6 |
| 5,355,011 | * | 10/1994 | Takata .................................. 257/408 |
| 5,726,469 | * | 3/1998 | Chen .................................... 257/285 |

* cited by examiner

Primary Examiner—William Mintel

(74) Attorney, Agent, or Firm—Pennie & Edmonds LLP

(57) ABSTRACT

A surface voltage sustaining structure for semiconductor device which includes at least one high-side high-voltage device, comprises at least two surface voltage sustaining regions, wherein a first surface voltage sustaining region is for sustaining a voltage drop from a high voltage terminal of the high-side high-voltage device to a floating voltage terminal of the high-side high-voltage device, and a second surface voltage sustaining region is for sustaining a voltage drop from said high voltage terminal or from said floating voltage terminal to the substrate. The potential of the floating-voltage terminal of the high-side high-voltage device can vary (float) from the potential of the substrate up to the potential of the high voltage terminal. By means of the present invention, not only a high-side high-voltage device but also a low-side high-voltage device with a high voltage terminal having potential being the same as the floating voltage terminal and a low voltage terminal having potential being the same as the potential of the substrate, and integrated circuit devices with common terminals having a potential being the same as the floating voltage terminal, as well as integrated circuit devices with common terminals having a potential being the same as the substrate can be implemented simultaneously on a single chip without using dielectric isolation technique or p-n junction isolation technique. The technique of the present invention is technologically compatible to the CMOS or BiCMOS technique.

20 Claims, 9 Drawing Sheets

SURFACE VOLTAGE SUSTAINING STRUCTURE FOR SEMICONDUCTOR DEVICES HAVING FLOATING VOLTAGE TERMINAL

TECHNICAL FIELD

The present invention relates to semiconductor high-voltage devices and high power devices, more particularly to a surface voltage sustaining structure for semiconductor devices in High-Voltage Integrated Circuits (HVICs) and Power Integrated Circuits (PICs), where the devices have a high-voltage terminal and at least a floating voltage terminal.

BACKGROUND OF THE INVENTION

The conventional techniques for manufacturing the high-voltage or power devices in HVICs or PICs use dielectric isolation (DI), p-n junction isolation (JI) and self isolation (SI). Among these three techniques, the isolation performance of DI is the best, and the JI is better than SI, whereas the cost of SI is the lowest, and the cost of DI is the highest.

As shown in FIG. 1, a conventional HVIC includes four portions: a low-voltage control circuit, a low-side driver connected to ground (substrate), a high-voltage level shifter and a high-side driver. It can be seen from FIG. 1 that a common terminal of the high-side driver is connected with a middle terminal of an output of a totem pole, and the potential of the middle terminal can vary from the voltage of the ground (substrate) up to that of a high-voltage bus. That is to say, this kind of power integrated circuit (or HVICs) has a common floating voltage terminal which is used as a low voltage terminal in the high-side driver, and other circuits use the substrate to be a common voltage terminal. In the conventional technique for high-voltage integrated circuits, the above-mentioned two kinds of circuits used to be formed on two chips, separately.

B. Murari et al. describe a BCD technique in "Smart Power ICs Technologies and Applications (Springer-veriag, Berlin, Heidelberg, New York, 1995)", which can be used to integrate the two kinds of circuits in a single chip. The BCD techniques, however, must use Di and JI technique so that its process is not technologically compatible with conventional CMOS or BiCMOS technology. It also needs a large area of a chip. Therefore, the cost of BCD technique is quite high. In the present technical field, an important task is to seek a method to fabricate the two kinds of circuits in a single chip without using DI and JI techniques and technologically compatible with conventional CMOS or BiCMOS technology so that the cost of the HVIC can be reduced. Moreover, as shown in FIG. 1, the high-voltage integrated circuit is used to drive at least two high-voltage devices connected in series, one of them is a high-side MOST and another is a low-side MOST. The two devices connected in series form a totem pole if one is an n-MOST and the other is also an n-MOST. The two devices connected in series form a CMOS if one is an n-MOST and the other is a p-MOST. Normally, the high-voltage power MOSTs in FIG. 1 are discrete devices, not Integrated on the chip. Therefore, the protection circuits of the power devices are complicated.

The present inventor has disclosed a technique for manufacturing a surface sustaining region in semiconductor device in U.S. Pat. No. 5,726,469 (X. B. Chen, "Surface Voltage Sustaining Structure for Semiconductor Device"). By using the technique of U.S. Pat. No. 5,726,469, a power device having excellent electrical performance can be realized without using DI and JI technique. In addition, since the implementation of the surface voltage sustaining structure of U.S. Pat. No. 5,726,469 is flexible, and may be technologically compatible with micron or sub-micron CMOS or BiCMOS technology, thereby the cost for manufacturing power device (or high voltage device) in power integrated circuits by using this technique is much lower than that by using DI and JI technology. FIG. 2 shows an example of manufacturing a high voltage diode by using the technique of U.S. Pat. No. 5,726,469. In this figure, two $p^+$-zones 3 and 4 cover on an $n^+$-region 2 formed on a $p^-$-substrate 1, a cathode K is located in the center of the $n^+$-region 2, and an anode A is connected with the substrate 1 through a $p^+$-zone 5. Obviously, in this method, the anode A must have a potential being the same as that of the substrate, and can not have a varying (or floating) high voltage relative to the substrate. That is to say, this kind of surface voltage sustaining structure can only apply to a device having a low voltage terminal connected to the substrate and a high voltage terminal relative to the substrate.

As above-mentioned, the power integrated circuit comprises not only device(s) with the substrate being a low voltage terminal (this kind of device is called as low-side device hereafter), but also high voltage device(s) with a varying (or floating) voltage at its low voltage terminal (this kind of device is called as high-side device hereafter), and the floating voltage may be very high. A high-side n-MOST device shown in FIG. 3 belongs to this kind of device, which can not be manufactured by means of the technique of U.S. Pat. No. 5,726,469. Furthermore, in a semiconductor power integrated circuit, some low voltage integrated circuit are often needed. This low voltage circuit has a common terminal connected to a floating voltage terminal of a high-voltage device having the floating voltage terminal. The block shown in FIG. 3 is this kind of low-voltage integrated circuit. In this kind of circuits, many devices are formed in a "tub", which has a function like a "substrate". There is a floating voltage between such a "substrate" and the substrate of a chip. The tub has a floating voltage from zero to very high, but the performance of those devices formed therein should not be affected by the floating voltage. One of the conventional methods for manufacturing the above mentioned integrated circuit is to form the high-side n-MOST on a chip (a discrete device) while the tub having a floating voltage terminal (Floating High-Voltage "TUB") is formed on another chip. If the low-side device sustains a voltage higher than 500V, and a current larger than 1 A, then still another discrete device is used. Another conventional method for manufacturing the integrated circuit is to form said three kinds of devices on a single chip with SI and JI technology. In this way, the disadvantages are high cost and large consumption of the chip area.

As shown in FIG. 4, the technique of U.S. Pat. No. 5,726,469 may also be used to manufacture the tub shown in FIG. 3. Compared with FIG. 2, the difference of FIG. 4 is that there is a p-zone 12, around the center. A frame surrounded by the dashed lines indicates a tub region which is not depleted when a breakdown voltage is applied at the floating voltage terminal SH. An examples of usage of the tub region is that low-voltage p-MOSTs can be made in the undepleted area of the $n^+$-region 2, and low-voltage n-MOSTs can be made on the undepleted area of the p-zone 12. The manufacturing method is the same as that for implementation of the conventional integrated circuit devices in n-"substrate" (here is the $n^+$-region 2) and p-well (here is the p-zone 12). However, the above method still has the disadvantage that the high-side high-voltage device having a floating voltage terminal can not be made on the same chip.

OBJECT OF THE INVENTION

The present invention is capable of providing a surface voltage sustaining structure for sustaining a high voltage to a floating voltage as well as for sustaining a high voltage or floating voltage to the substrate. The surface voltage sustaining structure may be formed by a method compatible to CMOS or BICMOS technology without using DI and JI technology.

Another object of the present invention is to provide a semiconductor device comprising at least a high-side high-voltage device having a high-voltage terminal and a floating voltage terminal.

Still another object of the present invention is to provide a high-voltage (or powering) integrated circuit comprising at least a high-side high-voltage device having a high-voltage terminal and a floating voltage terminal, and a low-side high-voltage device with floating voltage as its high voltage terminal and the substrate as its low voltage terminal. The two devices form a totem pole or CMOS. The two devices can be implemented by a technology compatible to the conventional CMOS or BICOMS technology without using DI and JI technology.

SUMMARY OF THE INVENTION

According to the present invention, a surface voltage sustaining structure for semiconductor device is provided, which comprises a substrate of first conductivity type, a heavily doped region of second conductivity type formed on said substrate, and one or more high-voltage terminals and one or more floating voltage terminals, wherein said surface voltage sustaining structure comprises:

a first surface voltage sustaining region for sustaining a voltage drop from one of said high-voltage terminals to one of said floating voltage terminals, including part of said heavily doped region of second conductivity type under the high-voltage terminal and several zones of first conductivity type formed in said heavily doped region of second conductivity type apart from said high-voltage terminal and having doping density increasing gradually or stepwisely as increasing of a distance to the high-voltage terminal, wherein said floating voltage terminal is located at one having largest doping density of said zones of first conductivity type; and a second surface voltage sustaining region for sustaining a voltage drop from said high-voltage terminal or floating voltage terminal to the substrate, including part of said heavily doped region of second conductivity type surrounding said first surface voltage sustaining region and several zones of second conductivity type in said heavily doped region of the second conductivity type, of which the effective density of ionized impurities of the second conductivity type decreases gradually or stepwisely as increasing of a distance to said high-voltage terminal or said floating voltage terminal, wherein said effective density of ionized impurities of the second conductivity type means a value obtained in the manner that when a voltage applied across the high voltage terminal and the substrate or across the floating voltage terminal and the substrate is close to breakdown voltage, the total number of the effective ionized impurities of the second conductivity type in a surface area having a lateral dimension smaller than $W_{pp}$ divides by said surface area, wherein $W_{pp}$ is a depletion width of an one-sided abrupt plane junction made by the same substrate under its breakdown voltage.

According to another aspect of the present invention, a semiconductor device comprising at least one high-side high-voltage device having a high-voltage terminal and a floating voltage terminal is provided, wherein said high-side high-voltage device is formed on the first surface voltage sustaining region of the surface voltage sustaining structure of the present invention.

The semiconductor device of the present invention may further comprise a low-side high-voltage device having a high voltage terminal connected with said floating voltage terminal of the high-side high-voltage device and a low voltage terminal connected with the substrate; and said low-side high-voltage device is formed on the second surface voltage sustaining region of the surface voltage sustaining structure of the present invention.

The semiconductor device of the present invention also may further comprise a plurality of low-voltage devices formed in a tub having a potential being the same as the floating voltage terminal wherein said tub is formed in a zone having largest doping density of first conductivity type in the first surface sustaining region of the surface voltage sustaining structure of the present invention.

The semiconductor device of the present invention still may further comprise a plurality of low-voltage devices which are formed on said substrate outside the surface voltage sustaining structure of the present invention.

[The semiconductor device of the present invention also may further comprise a low-side high-voltage device having a high voltage terminal connected with said floating voltage terminal of the high-side high-voltage device and a low voltage terminal connected with the substrate as well as a plurality of low-voltage devices formed in a tub having a potential being the same as the floating voltage terminal and formed in a zone having largest doping density of first conductivity type in the first surface voltage sustaining region of the surface voltage sustaining structure; and said low-side high-voltage device is formed on the second surface voltage sustaining region of the surface voltage sustaining structure of the present invention.

The semiconductor device of the present invention also may further comprise a low-side high-voltage device having a high voltage terminal connected with said floating voltage terminal of the high-side high-voltage device and a low voltage terminal connected with the substrate as well as a plurality of low-voltage devices formed on said substrate outside the surface voltage sustaining structure; and said low-side high-voltage device is formed on the second surface voltage sustaining region of the surface voltage sustaining structure of the present invention.

The semiconductor device of the present invention also may further comprise a plurality of low-voltage devices, wherein some of said plurality of low-voltage are formed in a tub having a potential being the same as the floating voltage terminal, wherein said tub is formed in a zone having largest doping density of first conductivity type in the first surface voltage sustaining region of the surface voltage sustaining structure of the present invention and some of the plurality of low-voltage devices are formed on said substrate outside the surface voltage sustaining structure of the present invention.

The semiconductor device of the present invention also may further comprise a low-side high-voltage device having a high voltage terminal connected with said floating voltage terminal of the high-side high-voltage device and a low voltage terminal connected with the substrate as well as a plurality of low-voltage devices; wherein said low-side high-voltage device is formed on the second surface voltage sustaining region of the surface voltage sustaining structure;

and some of said plurality of low-voltage devices are formed in a tub having a potential being the same as the floating voltage terminal, wherein said tub is formed in a zone having largest doping density of first conductivity type in the first surface voltage sustaining region of the surface voltage sustaining structure of the present invention; and some of said plurality of low-voltage devices are formed on said substrate outside the surface voltage sustaining structure of the present invention.

The technique of the present invention is technologically compatible to the CMOS or BiCMOS technique, and can implement an integrated circuit comprising a high-side high-voltage device having a floating low voltage terminal by means of conventional CMOS and BICMOS technology without using DI and JI technology. The high-side high-voltage device using the present invention has performance much better than that of a conventional lateral device. For example, the sustaining voltage of the semiconductor device of the present invention can achieve more than 90% of a breakdown voltage of one-sided abrupt parallel plane junction formed on the same substrate, with low on-voltage and large current density Another advantage of the present invention is that a high-side high-voltage device having a floating voltage terminal as the low voltage terminal, low voltage CMOS or BiCMOS circuit in a tub having a potential equal to that of the floating voltage terminal, and a low-side high-voltage device having a high voltage terminal connected to the floating voltage terminal, as well as low voltage CMOS or BiCMOS circuit on the substrate can be simultaneously fabricated on a single chip without using DI and JI technology. Therefore, chip area may be saved appreciably.

BRIEF DESCRIPTION OF THE DRAWINGS

In the drawings, the same reference signs denote the same or corresponding elements or portions.

DESCRIPTION OF THE PREFERRED EMBODIMENTS

Figure 5:
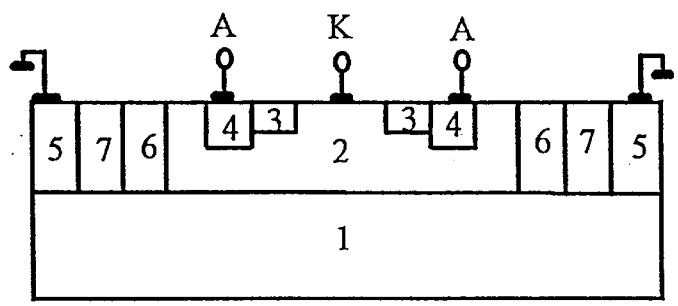
FIGS. 5, 6, 7, 8 and 9 are schematic cross-section views of several different structures of diodes with an anode A having a floating voltage manufactured according to the present invention.

FIG. 5 is a schematic cross-sectional view of a high-voltage diode with an anode having floating voltage according to the technique of the present invention. The structure of the diode has a first surface voltage sustaining region and a second surface voltage sustaining region. The first surface voltage sustaining region is a region surrounding central portion of an n+-region 2 formed on a p$^-$-substrate 1, the center of the n$^+$-region 2 is a high-voltage terminal K which is the cathode of the diode, On the n$^+$-region 2 of the first surface voltage sustaining region, a thin layer of p$^+$-zones 3 and 4 is covered except in a small area of the central portion, where the acceptor density of the zone 4 is larger than that of the zone 3. A floating voltage terminal A (anode of the diode) of the high-voltage diode is located close to the outer edge of the zone 4.

The average ionized donor density in the n+-region 2 is compensated by ionized acceptors in the p+-zones 3 and 4 when a voltage close to the breakdown voltage $V_B$ is applied to K and a voltage of zero is applied to A. The average effective ionized donor density is gradually or stepwisely reduced, as increasing of a distance from the center K, from $N_B W_{PP}$ to very small. Here, $N_B$ is doping concentration of the p$^-$-substrate 1, and $W_{pp}$ is the depletion width of a one-sided abrupt plane junction made by the same substrate under its breakdown voltage $V_B$.

According to the present invention, the donor density everywhere in the n$^+$-region 2 in the first surface voltage sustaining region is larger than $N_B W_{pp}$. When the anode A and the cathode K have the same potential being close to the breakdown voltage $V_B$, only a small part of the p$^+$-zones 3 and 4 are ionized to built a built-in voltage $V_{bi}$ between the n$^+$-region 2 and the p$^+$-zones 3 and 4 due to the covering p$^+$-zones 3 and 4 have a potential equal to the n$^+$-region 2, hence the effective density of the ionized donor does not vary with the distance from the center K. Then, the n$^+$-region 2 of the first surface voltage sustaining region and the p$^-$-region 1 is similar to a parallel plane junction. The ionized donor density is $N_B W_{pp}$ plus consumed donor density for building the built-in voltage $V_{bi}$ existing between the p$^+$-zone 3 and 4 and the n$^+$-region 2. The later is much smaller than the former, and can be neglected. Since the donor density of the n$^+$-region 2 under the p$^+$-zone 4 is larger than $N_B W_{pp}$ according to the present invention, from the center to a point under the p$^+$-zone 4, there is a neutral zone, which is not ionized. The neutral zone is an equi-potential area extending from the center K to the portion under the p+-zone 4 connected with A.

In this case, the voltage applied across the p$^+$-zone 4 (floating voltage terminal A) and p$^-$-substrate 1 is sustained by the second surface voltage sustaining region of the present invention. The second surface voltage sustaining region is from the n$^+$-region 2 surrounding the p$^+$-zone 4 to a p$^+$-zone 5 connected to the p$^-$-region 1. Two n$^+$-regions 6 and 7 are between the p$^+$-zone 5 and the n$^+$-region 2 surrounding the p$^+$-zone 4. The donor density of the n$^+$-region 6 is smaller than $N_B W_{pp}$, and the donor density of the n$^+$-region 7 is smaller than that of the n$^+$-region 6, so that the effective ionized donor density is gradually or stepwisely reduced with increasing of the distance from A towards p$^+$-zone 5 when the voltage applied across the p$^+$-zone 4 and p$^-$-substrate 1 is close to $V_B$. From U.S. Pat. No. 5,726,469, it is obvious that, across anode A and the substrate, a reverse voltage close to $V_B$ can be sustained.

The surface voltage sustaining structure is divided into two surface voltage sustaining regions in the above embodiment of the present invention. In the description of FIG. 5, the first surface voltage sustaining region is from the center of the n$^+$-region 2 to a boundary of the outer edge of the p$^+$-zone 4 and the n$^+$-region 2; the second surface voltage sustaining region is from this boundary to a boundary of the n$^+$-zone 7 and the p-zone 5. In fact, when the floating voltage terminal A has the same potential as the high voltage terminal K, a built-in voltage exists between the p$^+$-zone 4 and the n$^+$-region 2 (in general, the boundary between a p-region and n-region is called as metallurgical junction), which results a small portion of the p$^+$-zone 4 and the n$^+$-region 2 near the metallurgical junction being depleted. For a person skilled in the art, it is needless to say that the floating voltage terminal A should have a very small distance to the metallurgical junction. Thus, taking the outer edge of the p$^+$-zone 4 as the boundary of the first surface voltage sustaining region and the second surface voltage sustaining region is just for simplicity of description.

When the voltage on the anode A (i.e., floating voltage terminal) becomes lower than that on the high voltage terminal K, most part of the potential drop from the high voltage terminal K to the floating voltage terminal A is across from the high-voltage terminal K to the portion of the n$^+$-region 2 under the p$^+$-zone 4. Meanwhile, depleted areas in the p$^+$-zone 4 and in the n$^+$-region 2 adjacent the metallurgical junction also have a little part of the potential drop.

When the voltage on the anode A becomes zero, the p$^+$-zone 3 and most of the p$^+$-zone 4 between the cathode K and anode A are depleted. Thus, the effective ionized donor density from the terminal K to the terminal A of the first surface voltage sustaining region is gradually or stepwisely decreasing with the increasing of the distance from the center. Therefore, the cathode K still can sustain a very high voltage. Note that at a place in the n$^+$-region 2 under the p$^+$-zone 4, the voltage is not zero, because there are ionized acceptors in the p$^+$-zone 4, and ionized donors in the n$^+$-region 2 under the p$^+$-zone 4. This voltage is lower than $V_B$ and will not cause a breakdown since there is a second surface voltage sustaining region of the surface voltage sustaining structure from the outer edge of the p$^+$-zone 4 to the p$^+$-zone 5, where the p$^+$-zone 5 is connected to the substrate 1.

Figure 6:
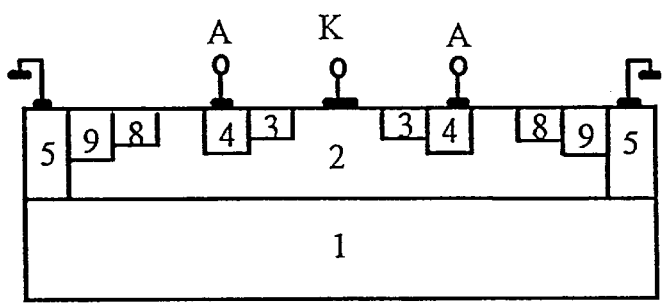

FIG. 6 shows another structure of a high-voltage diode with an anode having a floating voltage by using the present invention. The difference of FIG. 6 and FIG. 5 is that, in the second surface voltage sustaining region, the decreasing of the effective ionized donor density with the distance to the center is realized by a compensation of two p$^+$-zones 8 and 9 to the n$^+$-region 2, where the acceptor density of the zone 9 is higher than that of the zone 8. In order to prevent direct conduction between the p$^+$-zone 4 and the p$^+$-zone 8, they are separated by an n-type zone. In FIG. 6, the n-type zone for separating the p$^+$-zone 4 and the p$^+$-zone 8 is a part of the n$^+$-region 2.

In FIG. 5 and FIG. 6, when the voltage of anode A is a value of $V_{bi}$ (about 0.7V) higher than the voltage of cathode K, then the anode A and the cathode K are forward biased and the diode is conducting. Due to that $V_{bi}$ is much smaller than $V_B$, the mechanism of voltage sustaining is the same as both electrodes having the same voltage $V_B$. However, the effect of the parasitic transistor made by the anode A, cathode K and substrate 1 needs to be removed in most applications. This can be done by normal measures of reduction of the current amplification factor of a transistor, e.g., a great reduction of the lifetime of the minorities of the n$^+$-region 2.

Figure 7:
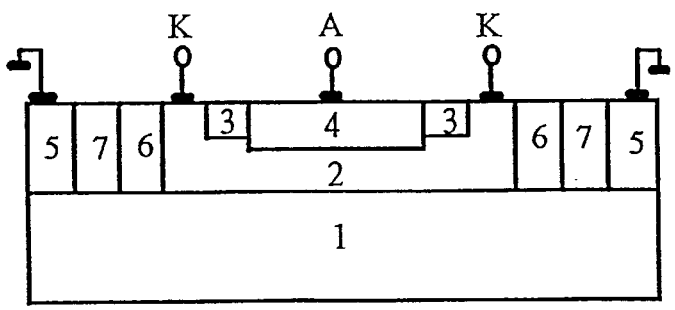

The diode shown in FIG. 7 has an anode A arranged in the center, and a cathode K arranged at both sides. The mechanism of voltage sustaining from the cathode K to the anode A is the same as that shown in FIG. 5, i.e., the voltage is sustained by the first surface voltage sustaining region. However, the voltage from the cathode K to the substrate 1, which is connected to the outer zone 5, is sustained directly by the second surface voltage sustaining region. That is to say, the second surface voltage sustaining region sustains the voltage applied on the high-voltage terminal to the substrate instead of to sustain the voltage applied on the floating voltage terminal to the substrate.

Figure 8:
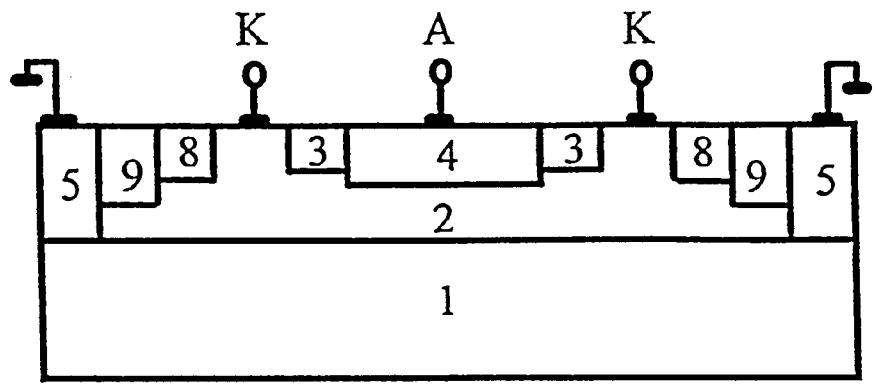

FIG. 8 shows another structure of a high-voltage diode. The difference between FIG. 8 and FIG. 7 is that the second surface voltage sustaining region in FIG. 8 uses the structure shown in FIG. 6 instead of using the structure shown in FIG. 5, i.e., to use the ionized acceptors in the zone 8 to compensate the ionized donors in the n$^+$-region 2 under the zone 8, and to use the ionized acceptors in the zone 9 to compensate the ionized donors in the n$^+$-region 2 under the zone 9, so that when the cathode K has a high voltage relative to the substrate, the compensated effective ionized donor density in the n$^+$-region 2 from the part under the cathode K to the edge thereof is reduced gradually or stepwisely.

Figure 9:
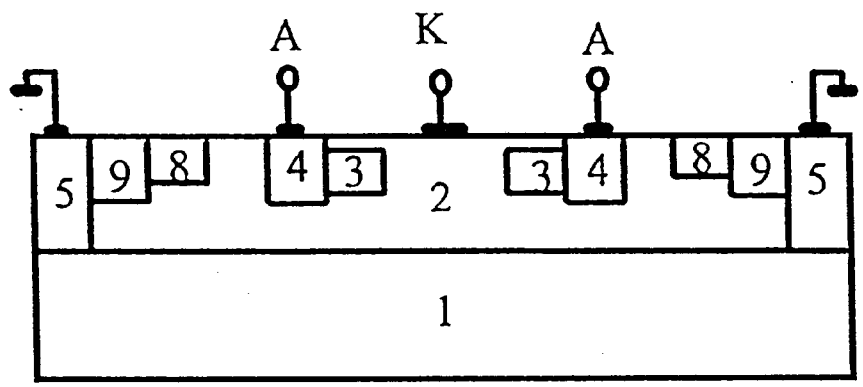

In the above-mentioned high-voltage diode, the floating voltage terminal A is connected to the p$^+$-zone 4 of the first conductivity type. Therefore, the p$^+$-zone 4 must be on the top of the n$^+$-region 2. However, it does not mean that the p$^+$-zone 3 of the first conductivity type must be formed on the top of the n$^+$-region 2. FIG. 9 shows an example where the p$^+$-zone 3 is not formed on the top of the n$^+$-region 2. In this figure, the n$^+$-region 2 under the p$^+$-zones 3 and 4 has an impurity density larger than $N_B W_{pp}$. When both voltages applied on the cathode K and anode A reach to $V_B$, the impurity density in the n$^+$-region 2 under the p$^+$-zone 3 and the p$^+$-zone 4 is large enough to make the junction between the n$^+$-region 2 and the substrate 1 be similar to a parallel plane junction and capable of sustaining a voltage of $V_B$. Here, only very small part of the impurities in the n$^+$-region 2 over the p$^+$-zone 3 is ionized for building a built-in voltage $V_{bi}$ between the n$^+$-region 2 and the p$^+$-zone 3. When the voltage applied on the cathode K reaches $V_B$ and the voltage applied on the anode A becomes zero, the p$^+$-zone 3 and the n$^+$-region 2 over the zone 3 are all depleted to cause the average ionized donor density decreasing as increasing of the distance from the center. Thus, the mechanism of? how to sustain the applied voltages is the same as the device shown in FIG. 5.

Owing to the fact that devices like MOST, BJT and JFET are based on the principle of an injection of carries to a reverse biased p-n junction and a control of this injection, the methods of building a diode with floating voltage terminal provided by this invention can be naturally used for making other kinds of devices, in which a floating voltage terminal exists. FIGS. 10, 11, 12, 13, 14, 15, 16, 17, 18 and 19 illustrate examples for making high-voltage n-MOST with a floating low voltage terminal by using this invention. It is apparent to those who skilled in the art that this invention can be applied to other devices with a floating low voltage terminal. Besides, needless to say, the first surface voltage sustaining region may not be limited to only have the p⁺-zone 3 and the p⁺-zone 4, and the second surface voltage sustaining region may not be limited to only have the zone 8 and zone 9 or the zone 6 and zone 7, just like what is stated in U.S. Pat. No. 5,726,469.

In FIGS. 10, 11, 12, 13, 14, 15, 16, 17, 18 and 19, the part corresponding to the high-voltage terminal K in FIG. 5 or FIG. 6 or FIG. 7 or FIG. 8 or FIG. 9 is a drain $D_H$ of a high-voltage n-MOST, the part corresponding to the floating voltage terminal A is a source $S_H$ of this n-MOST.

Figure 10:
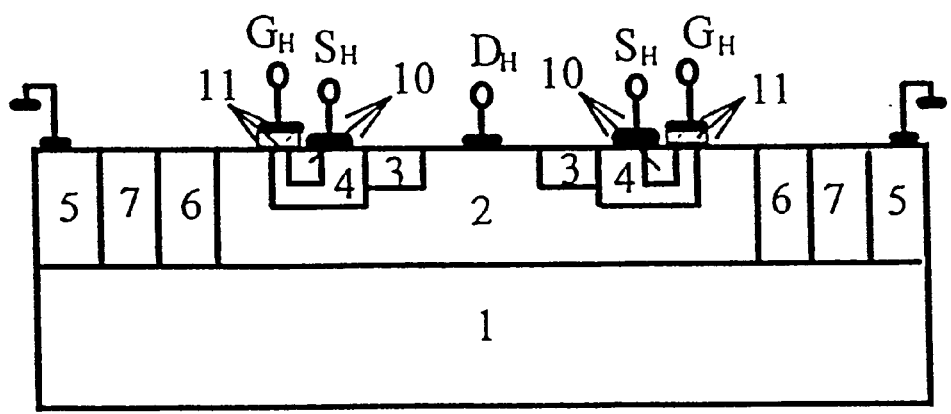
FIGS. 10, 11, 12, 13, 14, 15, 16, 17, 18 and 19 show cross-sections of several kind of structures of the high-side high-voltage MOST having varying (floating) source voltage, formed in the surface voltage sustaining structure of the present invention.

FIG. 10 shows an application of the structure shown in FIG. 5 to a high-side n-MOST. In FIG. 10, the zone 4 is also served as a source-body and it is connected to an n⁺-zone 10 on the top via an ohmic contact, where the zone 10 is the source region. There is an oxide layer 11 covering on the top from a part of the zone 10 to the outside of the zone 4. The layer 11 serves as the gate-oxide and is covered by a conductor, which is the gate $G_H$ of the n-MOST. When the voltage of the gate $G_H$ reaches the threshold voltage, electrons can flow from the zone 10 to the inversion layer formed on the top of the zone 4 and eventually to $D_H$.

Figure 11:
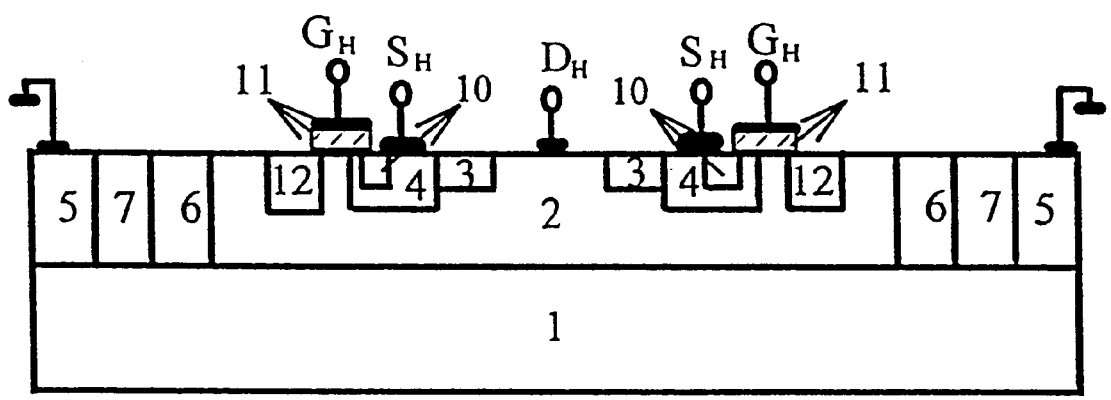
Figure 12:
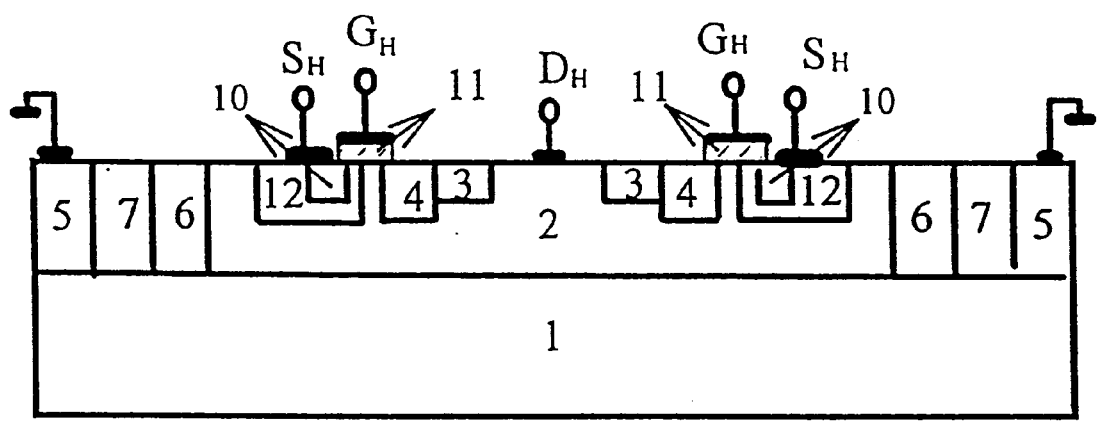

In case of an improvement of field profile under the gate $G_H$ in FIG. 10 is necessary, another p⁺-zone 12 can be arranged under the gate $G_H$, which can be not connected to the source region 4 as shown in FIG. 11. However, the p⁺-zone 12 can also be connected to the zone 4 via an external connection not shown in FIG. 11. Further, the n⁺-source region 10 also may be arranged in the p⁺-zone 12, as shown in FIG. 12. In the latter case, the source electrode $S_H$ should be formed on the top of both the p⁺-zone 12 and the n⁺-zone 10.

Figure 13:
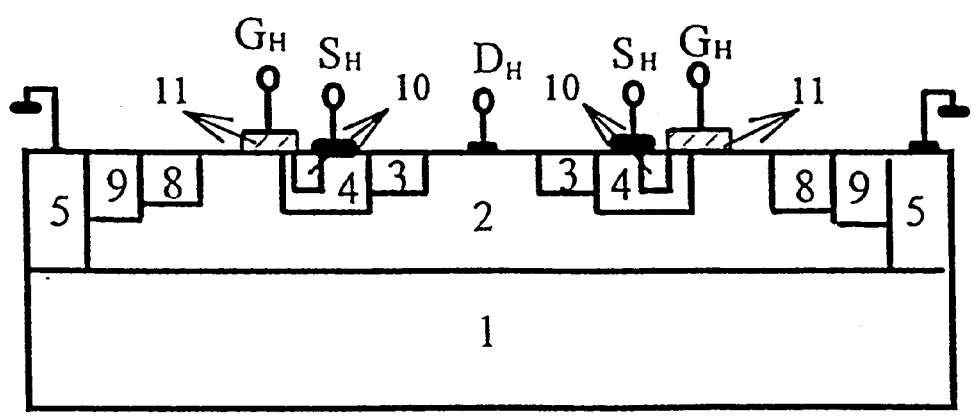

As shown in FIG. 6, the zones 6 and 7 shown in FIG. 5 can be replaced by the p-zones 8 and 9 on the n-type region 2. FIG. 13 shows such a replacement of FIG. 10. Of course, such a replacement can also be used in the structures shown in FIG. 11 and FIG. 12.

Figure 14:
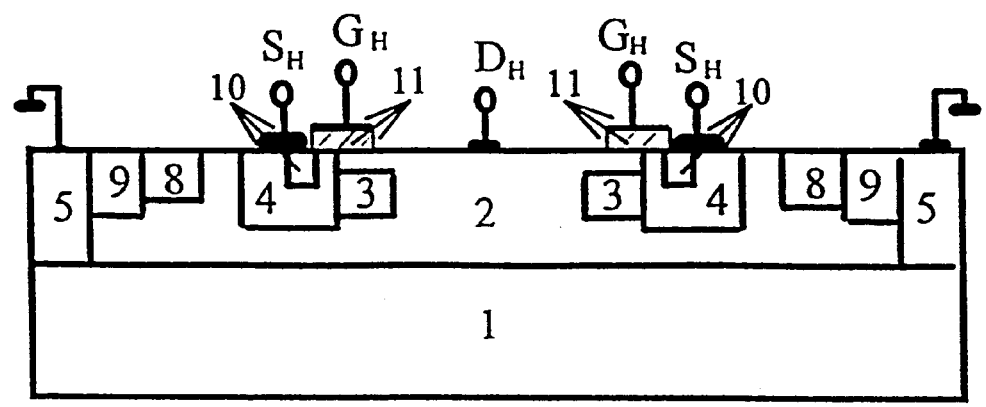

FIG. 14 shows a cross section of a high-side n-MOST with a floating voltage terminal as the low voltage terminal, which is made by using the surface voltage sustaining structures shown in FIG. 9. Compared with those shown in FIGS. 10, 11, 12 and 13, the advantages of this device is that when the voltage applied on the source $S_H$ is close to $V_B$, the n⁺-region 2 over the p⁺-zone 3 keeps undepleted so that the on-resistance between $D_H$ and $S_H$ is smaller than those of FIGS. 10, 11, 12 and 13.

Figure 15:
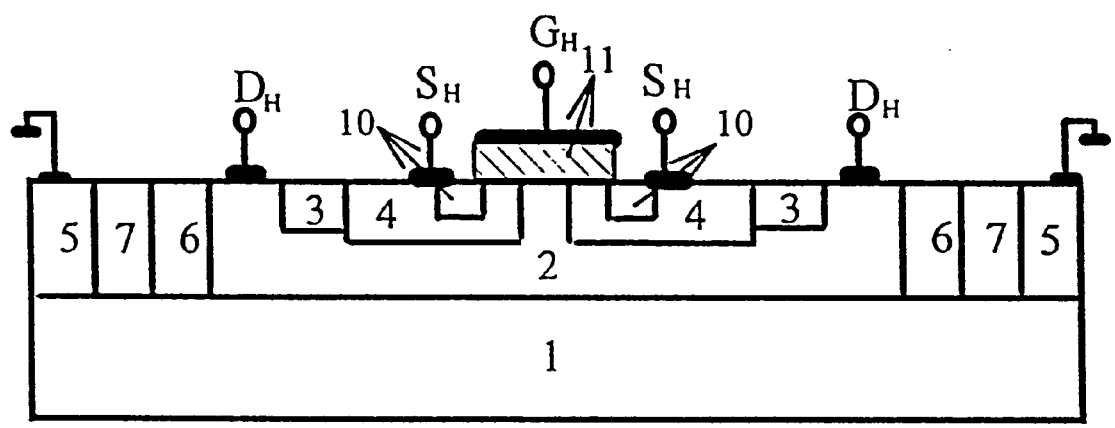

The high-side high voltage device shown in FIG. 15 uses the second surface voltage sustaining region shown in FIG. 7 for sustaining the voltage applied to the drain electrode $D_H$ and the substrate, while the first surface voltage sustaining region shown in FIG. 7 is used for sustaining a voltage drop from the drain $D_H$ to the floating voltage terminal $S_H$. The gate $G_H$ of the high-side device is arranged at the center. When the voltage applied on the gate $G_H$ exceeds the threshold voltage, electrons can flow from the source $S_H$ and the n⁺-region 10 via a surface inversion layer in the p⁺-zone 4 under the gate $G_H$ towards the center of the n⁺-region 2, then flow along the n⁺-region 2 and divert to two sides under the p⁺-zones 3 and 4. Finally, the electrons are collected by the electrode $D_H$.

Figure 16:
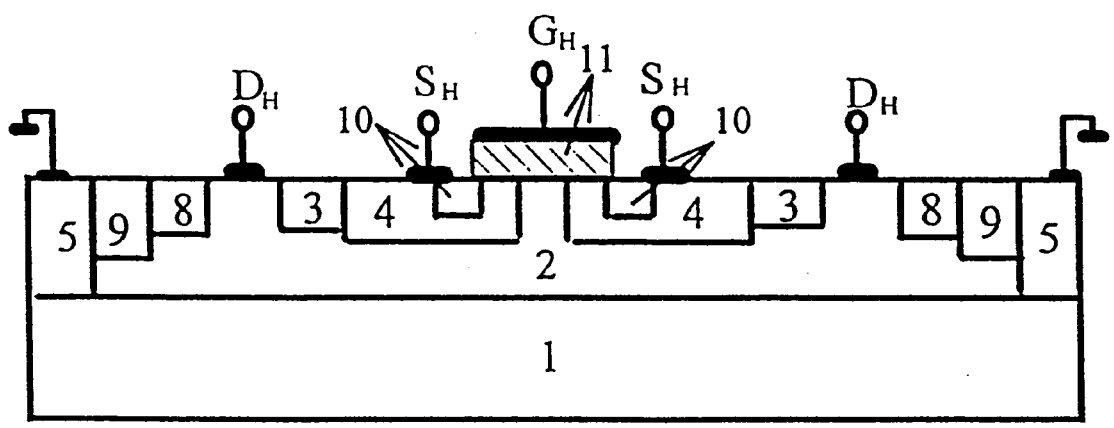

FIG. 16 shows a high-side n-MOST based on the structure of FIG. 8. The difference between FIG. 16 and FIG. 15 is only that the n-zones 6 and 7 in FIG. 15 are replaced by the p-zones 8 and 9 on the top of the n⁺-region 2, wherein the doping density of the p-zones 8 and 9 is gradually increased with a distance from the first surface voltage sustaining region.

Figure 17:
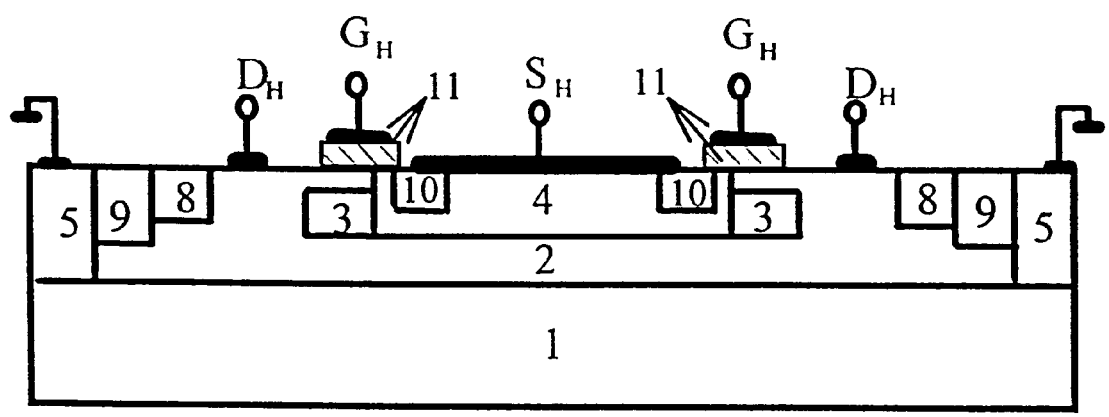

FIG. 17 shows another example of a high-side n-MOST with a second surface voltage sustaining region for sustaining a voltage between an electrode $D_H$ and the substrate. Compared with FIG. 16, the difference is that the gate $G_H$ is arranged at two edges of the zone 4 rather than at the center. Like that shown in FIG. 14, here, an n-region (a part of the n⁺-region 2) over the p⁺-zone 3 is used for reducing on-resistance.

Figure 18:
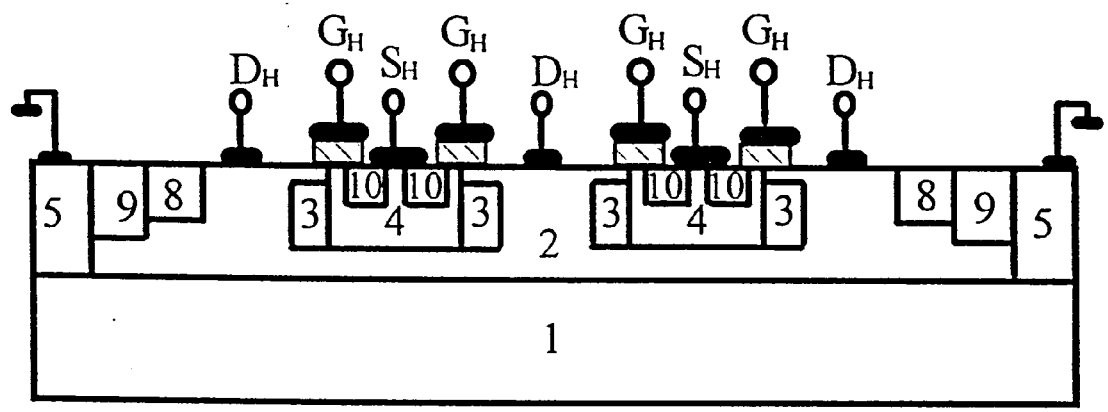

Actually, many first voltage sustaining regions may be arranged in the n⁺-region 2 surrounded by the second surface voltage sustaining region. FIG. 18 shows an example of a high-side n-MOST having four first voltage sustaining regions. The high-side n-MOST has three drain electrodes $D_H$, and two floating voltage terminals $S_H$ formed in the middle of each neighboring pair of drain electrodes $D_H$, wherein one drain electrode $D_H$ is located in the middle of said two floating voltage terminals $S_H$. Each of gate $G_H$ corresponds to a high-side n-MOST. So, there are four high-side n-MOSTs in the structure of FIG. 18. In general, the four high-side n-MOSTs are connected in parallel to form one high-side n-MOST, then, the total gate width is larger than that in FIG. 17. In FIG. 18. The shaded areas represent oxide layer 11.

Figure 19:
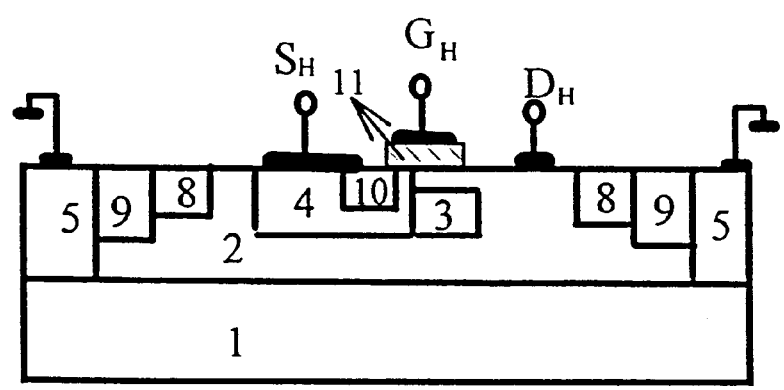

It should be noted that in the present invention, the first surface voltage sustaining region can sustain the voltage between the high voltage terminal and the floating voltage terminal, while the second surface voltage sustaining region not only can sustain the voltage between the floating voltage terminal and the substrate, but also can sustain the voltage between the high voltage terminal and the substrate. FIG. 19 shows a high side n-MOST, which uses the second surface voltage sustaining region for sustaining simultaneously the voltage between the high voltage terminal and the substrate as well as the voltage between the floating voltage terminal and the substrate.

Figure 20:
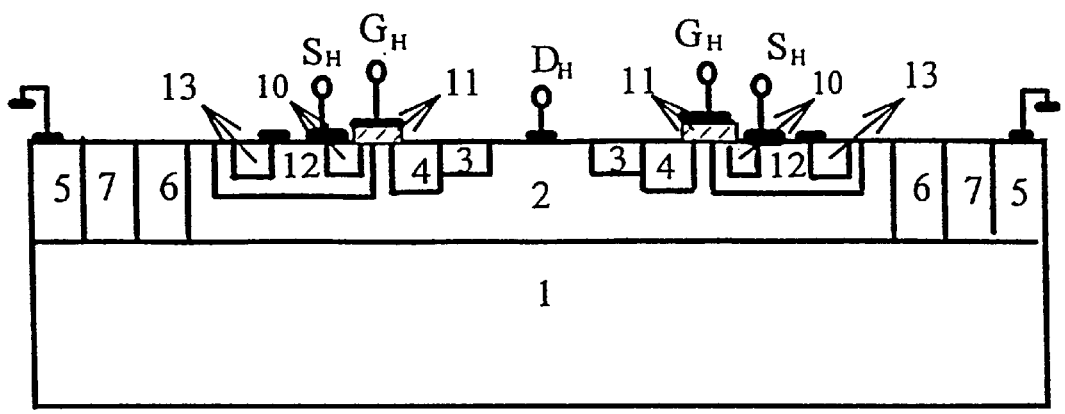
FIGS. 20 and 21 show cross-sections of two kind of structures of the present invention, both of them have a high-side MOST having varying (floating) source voltage as well as a tub having potential equal to the source voltage.

By using the structure of the present invention, not only a high-side high voltage devise having a floating voltage terminal can be made, but also an integrated circuit comprising a plurality of low voltage devices in a tub having a potential equal to that of the floating voltage terminal can be made on the zone of the first conductivity type having a largest doping density in the first surface voltage sustaining region, thereby to save the area of chip. FIG. 20 shows still another embodiment of the present invention, which has a structure similar to that of FIG. 12, except the p-zone 12 is enlarged for making an n-zone 13 in it. Even though the voltage applied on the terminal $S_H$ equals to zero, the p-zone 12 still have an undepleted area and n-zone 13 is inside this area. This undepleted area of the zone 12 provides a "tub". Low voltage n-MOSTs and p-MOSTs can be made in zone 12 and zone 10, respectively. The zone 12 has a potential equal to the floating voltage on the electrode $S_H$.

Figure 21:
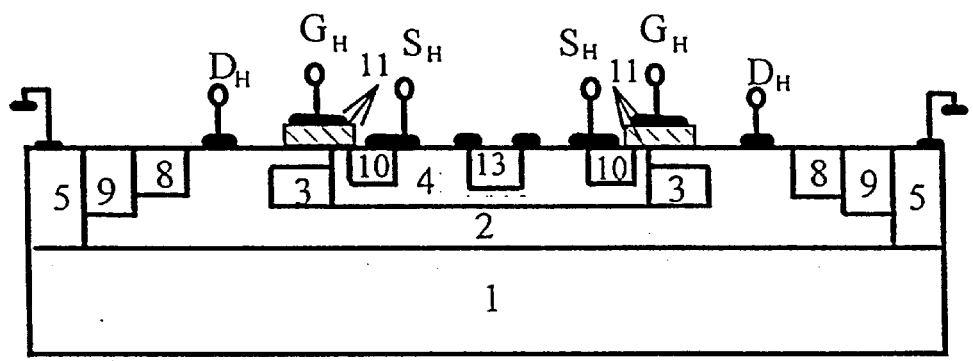

FIG. 21 shows another example for simultaneously forming a high-side device and a tub in the first surface voltage sustaining region. Here, the potential drop from the high voltage terminal $D_H$ of the high-side device to the substrate is sustained by the second surface voltage sustaining region, and the potential drop from the high voltage terminal $D_H$ to the floating voltage terminal $S_H$ is sustained by the first surface voltage sustaining region. In FIG. 21, the n-zone 13 is arranged in the center of the ozone 4. A plurality of n-MOSTs can be made in the undepleted area of the zone 4, and a plurality of p-MOSTs can be made in the zone 13. The undepleted area of the zone 4 forms a tub. The zone 13 stated above related to FIG. 20 and FIG. 21 is similar to the n-well in the conventional CMOS and BiCMOS integrated circuits, except that the n-wells here are made on a tub which is the undepleted area of zone 12, whereas in the conventional ones they are made on the p⁻-substrate. Needless to say, if some n-wells in the tub of FIG. 20 and FIG. 21 need to be equi-potential with the tub, then an ohmic contact to connect a part of zone 13 and a part of zone 12 (or zone 4) should be made in FIG. 20 (or FIG. 21).

Figure 22:
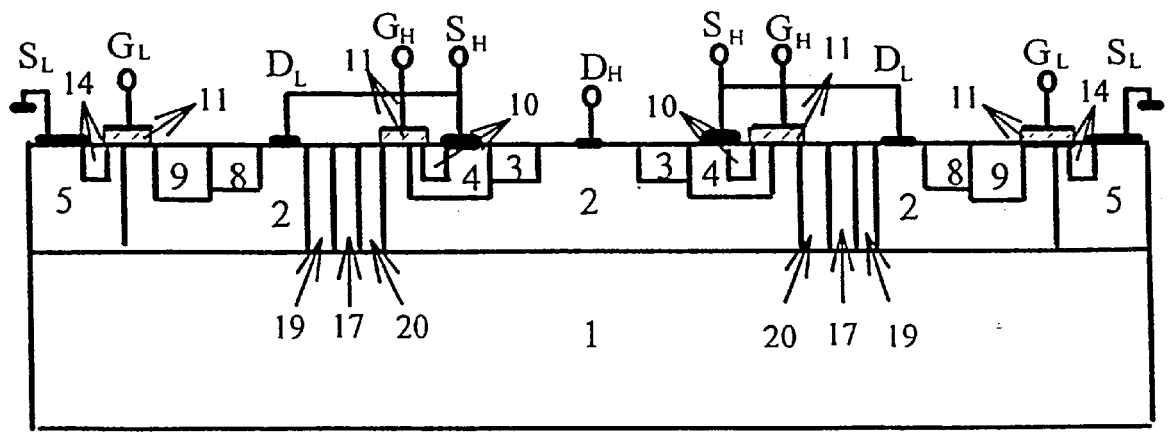
FIG. 22 shows a high-side MOST and a low-side MOST (totem-pole) according to the present invention.

In many cases of power integrated circuits, a totem pole is often necessary to be made. The device connected to the highest voltage terminal is called as high-side device or upper device, of which a floating voltage terminal is connected to a high voltage terminal of a low-side device or lower device. The potential of the low voltage terminal of the low-side device is kept as the same as the substrate (or called as ground potential). According to the present invention, not only high-side device with excellent performance, but also low-side device with excellent performance can be made. The low-side devices can be formed in the second surface voltage sustaining region of the present invention so that the additional area for forming the low-side device can be saved. FIG. 22 shows an embodiment to make a high-side n-MOST and a low-side n-MOST simultaneously. The example is based on that shown in FIG. 13. The modification to FIG. 13 is that, an n⁺-zone 14 is formed inside the p⁺-zone 5, and a part of the n⁺-region 2 between the zone 4 and the zone 8 is replaced by a p-zone 17 and n-zones 19 and 20, wherein the zone 19 and zone 20 are formed on two sides of the zone 17. Besides, the zone 9 has a small distance to the zone 5 instead of directly connected each other. The zone 14 is used as a source region of the low-side n-MOST. The zones 14 and 5 are connected each other on their top via source electrode $S_L$ of the low-side n-MOST. From a part of the n⁺-zone 14 to the adjacent n⁺-region 2, an oxide layer is covered on the top. A gate electrode $G_L$ of the low-side n-MOST is on the top of the oxide layer. The zones 17, 19 and 20 are for blocking electrons flow directly from the second surface voltage sustaining region to the first surface voltage sustaining region via the n⁺-region 2. A drain electrode $D_L$ of the low-side n-MOST is arranged outside the zone 19 and on the top of the n⁺-region 2, and is connected with the source electrode $S_H$ of the high-side device via an outer connection.

Figure 23:
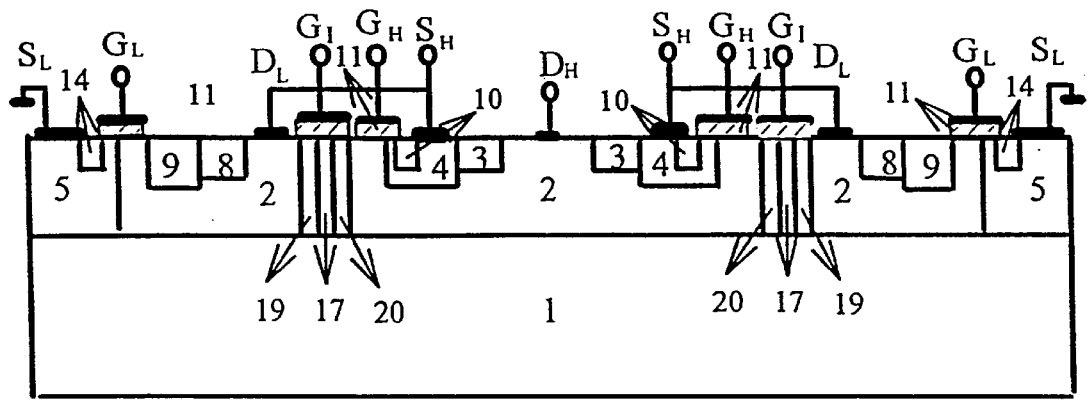
FIGS. 23, 24, 25 and 26 are other variations of the structure shown in FIG. 22.

FIG. 23 shows a modification of the device shown in FIG. 22. Here, an oxide layer (shaded region) is formed on the top of the zones 20, 17 and 19, and a conductor is made on the top of the oxide layer to form an electrode $G_I$. An external voltage can be applied to $G_I$ to modify the potential distribution in the zones 20, 17 and 19. When the external applied voltage on $G_I$ is chosen properly, there can be an electron barrier in the zone 17 to prevent the electron flow directly form the second surface voltage sustaining region to the first surface voltage sustaining region.

Figure 24:
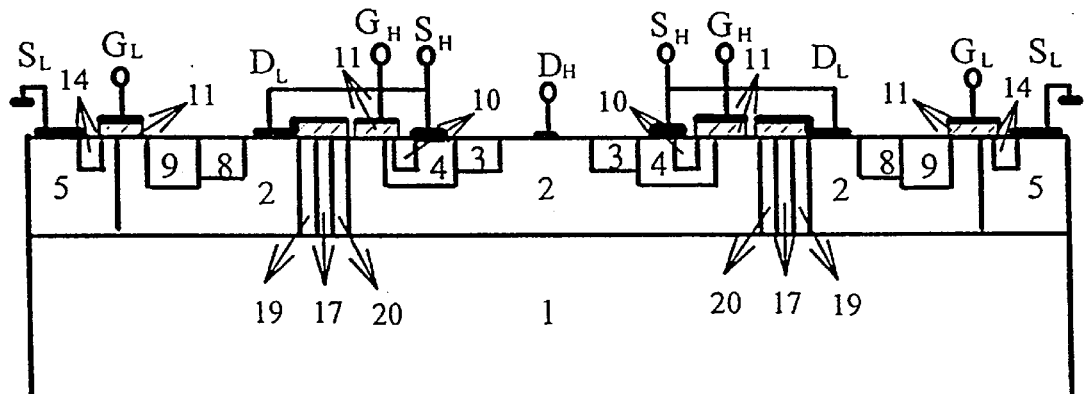

FIG. 24 shows a modification of the device shown in FIG. 23. Here, the electrode $G_I$ in FIG. 23 is electrically connected to the drain $D_L$ of the low-side n-MOST shown in FIG. 23. This kind connection of $G_I$ is normally called as field plate. The arrangement of the field plate can produce an electron barrier under it so that the electrons are difficult to flow directly from the drain $D_L$ of the low-side device to the drain $D_H$ of the high-side device.

Figure 25:
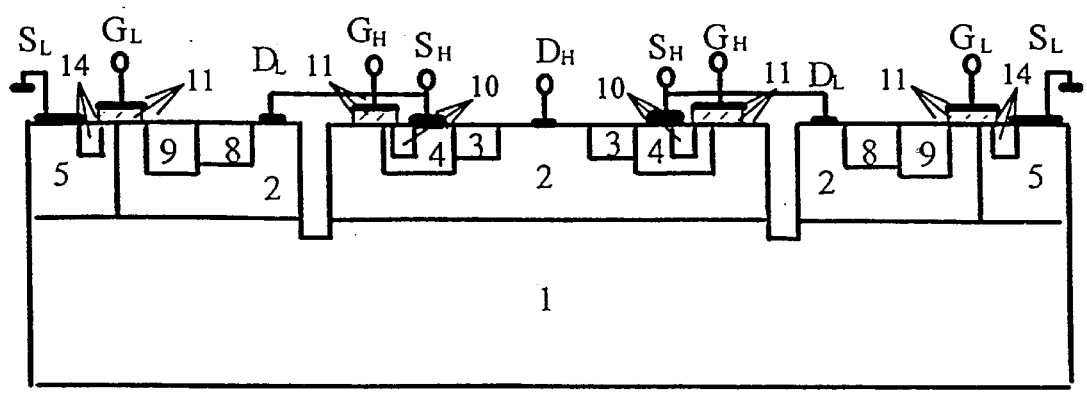

Another way to block the electron flow directly from the second surface voltage sustaining region to the first surface voltage sustaining region is schematically shown in FIG. 25. This figure differs from FIG. 22 in that the zones 20, 17 and 19 are now replaced by a trench. Due to the existing of a trench, the electrons can not flow directly from the first surface voltage sustaining region to the first surface voltage sustaining region. Obviously, an insulator set in the trench, in case of it is necessary, doesn't change the mechanism of blocking the electron flow.

Figure 26:
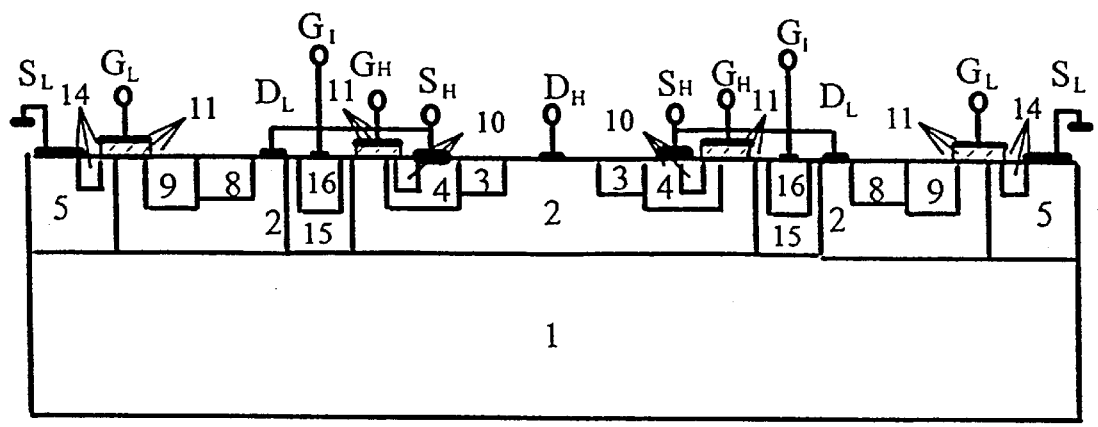

The blocking of the electron flow from the second surface voltage sustaining region to the first surface voltage sustaining region can also be realized by a reverse biased voltage which is applied on a p-n junction to separate the two surface voltage sustaining regions. As shown in FIG. 26, an n-zone 15 is formed between the first surface voltage sustaining region and the second surface voltage sustaining region, and a p-zone 16 is formed in the n-zone 15. An electrode $G_I$ is formed on the top of the p-zone 16.

It should be pointed out that even the voltage, $V_1$, applied across the electrode $S_H$ and the substrate, is zero, there is still a voltage, $V_2$, across a place around the zone 4 in the n⁺-region 2 of the first surface voltage sustaining region and the substrate. This is because, the doping density in the n⁺-region 2 should be larger than $N_B W_{pp}$ as stated before, and such a large doping density makes a part of the n⁺-region 2 around the zone 4 can not be fully depleted even when the voltage across $S_H$ and the substrate is zero. The voltage $V_2$ across such a non-depleted part of n⁺-region 2 and the substrate is the same as that across such a part and $S_H$ ( or $D_L$) when $V_1$ is zero. Normally, $V_2$ is larger than $V_1$ when $V_1$ is not zero. That is to say, the potential at such a non-depleted part of the n⁺-region 2 in the first surface voltage sustaining region is larger than that in the second surface voltage sustaining region. Therefore, the electrons can flow from the second surface voltage sustaining region to the first surface voltage sustaining region.

Now, if a negative voltage $V_I$ applied to $G_I$ in FIG. 26 is so large that the n-zone 15 not only is fully depleted, but also makes an area inside it having a potential lower than $V_1$, then, there is an electron barrier between the second surface voltage sustaining region and the first surface voltage sustaining region, and the electron flow from the second surface voltage sustaining region to the first surface voltage sustaining region can be blocked. The magnitude of the negative voltage $V_I$ needs not to be too large so that the area having a potential lower than $V_1$ has still a positive potential, preventing the hole flow from the zone 16 to the substrate via the zone 15.

The function of the zones 15 and 16 for blocking electron flow or hole flow is similar to the blocking mechanism of a JFET or SIT. Also, a method such as to use an insulator to substitute the zone 15 and to use a conductor to substitute the zone 16 in FIG. 26 can be used for blocking the electron flow. For those who are skilled In the art, it is obvious that there are other blocking methods to prevent an unwanted carrier flow from the second surface voltage sustaining region to the first surface voltage sustaining region or vice versa. For instance, in FIG. 22. if zone 20 and zone 19 are the same conductivity type as the substrate 1, (i.e., p-type instead of n-type) and zone 17 is the same conductivity type as zone 2, (i.e., n-type instead of p-type), then zone 17 becomes a floating field limiting ring. Needles to say, a multiple of floating field limiting rings can also be used instead of just one ring between the first surface voltage sustaining region and the second surface voltage sustaining region.

Figure 27:
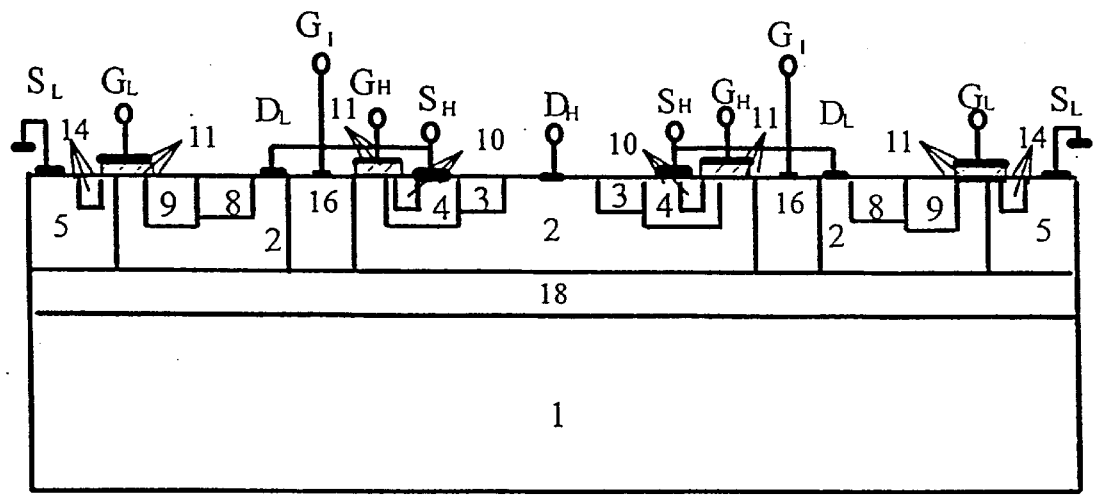
FIG. 27 is a cross-section of a totem pole structure on SIS made by the technique according to the present invention.

The present invention is also applicable for the case of that an insulating layer is between the surface voltage sustaining regions and the substrate, i.e., the case of SIS. In such a case, the blocking of the electron flow directly from the second surface voltage sustaining region to the first surface voltage sustaining region is readily to be implemented. FIG. 27 shows schematically a cross-section of a totem pole made by SIS. The difference between FIG. 27 and FIG. 26 is that there is an insulator layer 18 inserted between the substrate and the surface voltage sustaining regions, and there is no n-zone 15. Now, if a voltage applied to $G_I$ is low enough, the electron flow is blocked. In addition, since there is an insulator layer 18, the holes can not flow from $G_I$ to the substrate.

Figure 28:
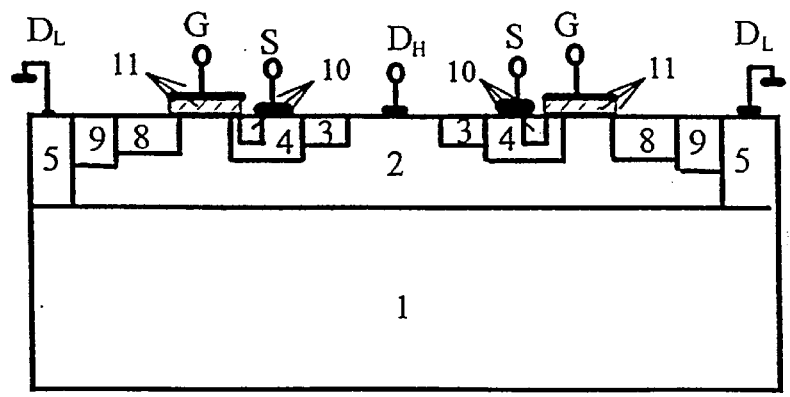
FIG. 28 shows a cross-section of a high-voltage CMOS made by the technique according to the present invention.

FIG. 28 shows schematically the cross-section of a high-voltage CMOS by a modification of that FIG. 13, where the gate oxide 11 and gate electrode $G_H$ are now extended to the n-zone 8. Here, the gate electrode is simply marked as G. The part corresponding to $S_H$ of FIG. 13 is an electrode S, which is the source of the high-side n-MOST, and also is the source of the low-side p-MOST. When the voltage applied on G is larger than the threshold voltage of the n-type region 2, then an inversion layer is formed beneath the gate oxide, the holes can flow from the p-zone 4 to the p-zone 8 via the inversion layer, and eventually to the ground electrode of the p-zone 5 connected to the substrate, that is, the low-side p-MOST is turned on. Note that only one gate electrode and one source electrode are used here, which is different from a conventional CMOS, in the latter case, the two MOSTs have different gate electrodes and source electrodes.

Figure 1:
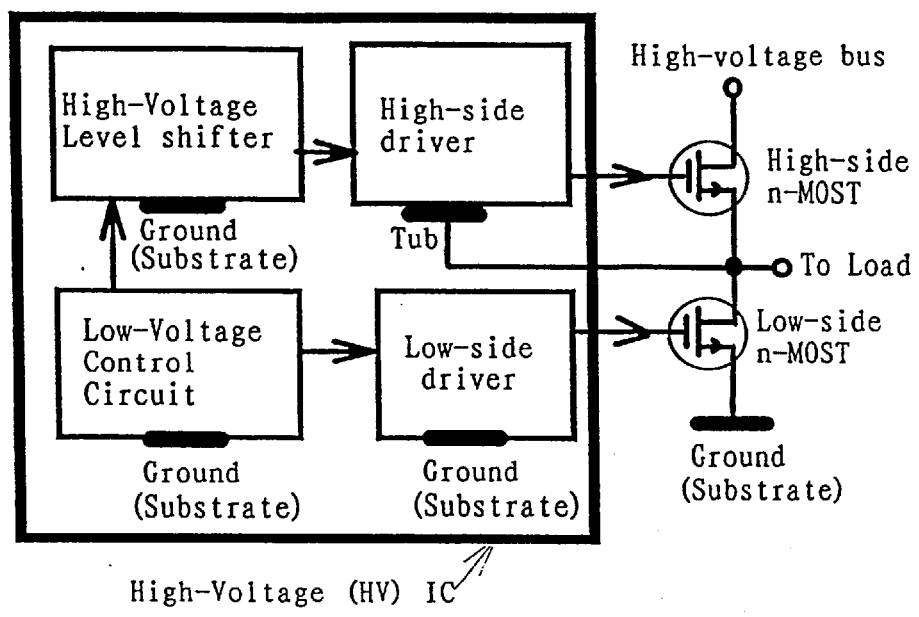
FIG. 1 shows schematically a conventional high voltage integrated circuit and an application thereof.
Figure 2:
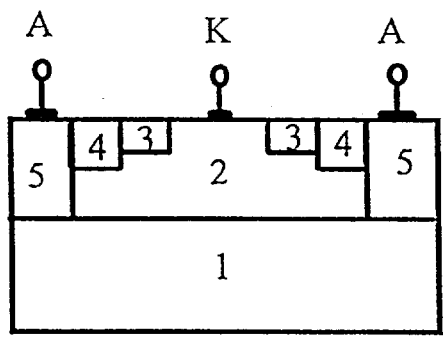
FIG. 2 shows a cross-section of a high-voltage diode formed by the technique of U.S. Pat. No. 5,726,469.
Figure 3:
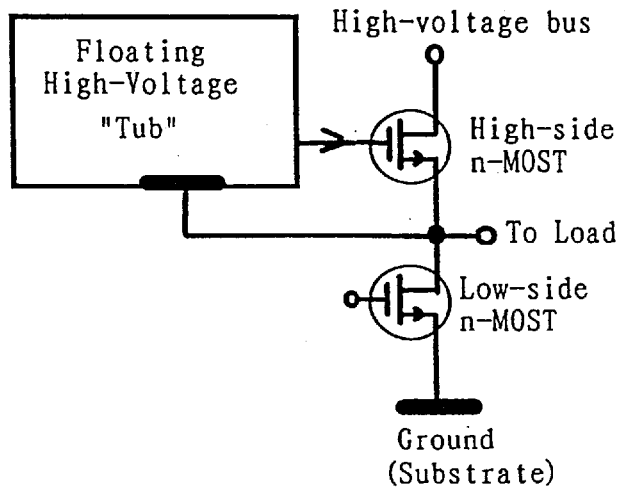
FIG. 3 schematically shows a typical high-voltage integrated circuit and the application thereof. The high-voltage integrated circuit in a tub is used for driving a high-side high voltage device with a floating voltage terminal as low voltage terminal. The tub has a potential equal to the floating voltage terminal. A low-side high voltage device is connected in series with the high-side high voltage device. Both high voltage devices are discrete devices, and the tub is made on a separate chip.
Figure 4:
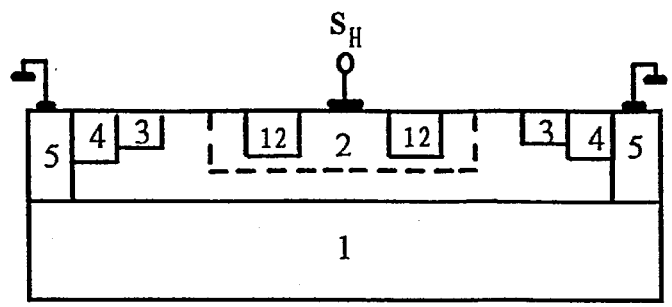
FIG. 4 shows a tub having a varying (floating) voltage formed by the technique of U.S. Pat. No. 5,726,469.

It can be seen from the above description, by using the technique of the present invention, all parts of the circuit shown in FIG. 1 can be implemented in a single chip without using SI and JI technology, thereby the area of the chip and the cost of manufacturing of the circuit are reduced.

The above mentioned examples are all described on the basis of devices formed on a p$^-$-substrate. It is obvious for a person skilled in the art that the technique of the present invention can be used to an n$^-$-substrate without any difficulty. In that case, "high voltage" and "floating voltage" means the highest negative voltage and floating negative voltage relative to the substrate, respectively. Also, a person skilled in the art can use a lot of ways for blocking the electrons (or holes) flow from the second surface voltage sustaining region (or the first surface voltage sustaining region) to the first surface voltage sustaining region (or the second surface voltage sustaining region).

What is claimed is:

1. A surface voltage sustaining structure for semiconductor device which comprises a substrate of first conductivity type, a heavily doped region of second conductivity type formed on said substrate, and one or more high-voltage terminals and one or more floating voltage terminals, wherein said surface voltage sustaining structure comprises:

a first surface voltage sustaining region for sustaining a voltage drop from one of said high-voltage terminals to one of said floating voltage terminals, including part of said heavily doped region of second conductivity type under the high-voltage terminal and several zones of first conductivity type formed in said heavily doped region of second conductivity type apart from said high-voltage terminal and having doping density increasing gradually or stepwisely as increasing of a distance to the high-voltage terminal, wherein said floating voltage terminal is located at one having largest doping density of said zones of the first conductivity type; and a second surface voltage sustaining region for sustaining a voltage drop from said high-voltage terminal or floating voltage terminal to the substrate, including part of said heavily doped region of second conductivity type surrounding said first surface voltage sustaining region and several zones of second conductivity type in said heavily doped region of the second conductivity type, of which the effective density of ionized impurities of the second conductivity type reduces gradually or stepwisely as increasing of a distance to said high-voltage terminal or said floating voltage terminal, wherein said effective density of ionized impurities means a value obtained in the manner that when a voltage applied across the high voltage terminal and the substrate or across the floating voltage terminal and the substrate is close to the breakdown voltage, the total number of the effective ionized impurities of the second conductivity type in a surface area having a lateral dimension smaller than $W_{pp}$ divides by said surface area, wherein $W_{pp}$ is a depletion width of an one-sided abrupt plane junction made by the same substrate under its breakdown voltage.

2. The surface voltage sustaining structure of claim 1, further comprising at least one additional first surface voltage sustaining region for sustaining a voltage drop from one of other high-voltage terminals to the floating voltage terminal or from the high-voltage terminal to one of other floating voltage terminals.

3. The surface voltage sustaining structure of claim 1, wherein in said first surface voltage sustaining region, the density of impurities of second conductivity type under all said zones of the first conductivity type is not smaller than $N_B W_{pp}$, wherein $N_B$ is the doping concentration of the substrate.

4. The surface voltage sustaining structure of claim 1, wherein the effective density of said impurities of the second conductivity type in the second surface voltage sustaining region reduced gradually or stepwisely is made by either varying the doping density of second conductivity type or by means of compensation of the impurities of the first conductivity type in upper portion of the surface voltage sustaining structure.

5. The surface voltage sustaining structure of claim 1, wherein a thin insulating layer is provided between said substrate of the first conductivity type and said heavily doped region of second conductivity type.

6. The surface voltage sustaining structure of claim 1, wherein a trench with or without an insulator inside of it is provided between said first surface voltage sustaining region and said second surface voltage sustaining region.

7. The surface voltage sustaining structure of claim 1, wherein a narrow semiconductor zone is formed between said first surface voltage sustaining region and said second surface voltage sustaining region in order to prevent a flow of carriers from one of said surface voltage sustaining region to another.

8. The surface voltage sustaining structure of claim 7, wherein said narrow semiconductor zone between said first surface voltage region and said second surface voltage region has one subzone of first conductivity type and two subzones of second conductivity type and wherein said subzone of first conductive type is located in-between said two subzones of the second conductivity type.

9. The surface voltage sustaining structure of claim 8, wherein an insulating film is formed on said narrow semiconductor zone, and a field plate is formed on said insulating film and connected to the top of the adjacent part of the second surface voltage sustaining region.

10. The surface voltage sustaining structure of claim 8, wherein an insulating film is formed on said narrow semiconductor zone, and a conductor is formed on said insulating film, wherein a voltage lower than that applied on said floating voltage terminal may be applied on said conductor.

11. The surface voltage sustaining structure of claim 7, wherein said narrow semiconductor zone between said first voltage sustaining region and second voltage sustaining region has one subzone of first conductivity which is surrounded by other subzones of second conductivity type except on the top of said subzone of first conductivity type and a voltage lower than that on said floating voltage terminal may be applied on said subzone of first conductivity type.

12. The surface voltage sustaining structure of claim 5, wherein a narrow semiconductor zone of first conductivity type is formed between said first voltage sustaining region and said second voltage sustaining region and a voltage lower than that on said floating voltage terminal may be applied on said zone of first conductivity type.

13. A semiconductor device of claim 1, comprising at least one high-side high-voltage device having a high-voltage terminal and a floating voltage terminal, wherein said high-side high-voltage device is formed on the first surface voltage sustaining region of the surface voltage sustaining structure.

14. A semiconductor device of claim 13, further comprising a low-side high-voltage device having a high voltage terminal connected with said floating voltage terminal of the high-side high-voltage device and a low voltage terminal connected with the substrate; and said low-side high-voltage device is formed on the second surface voltage sustaining region of the surface voltage sustaining structure.

15. A semiconductor device of claim 13, further comprising a plurality of low-voltage devices formed in a tub having a potential being the same as the floating voltage terminal wherein said tub is formed in a zone having largest doping density of the first surface sustaining region of the surface voltage sustaining structure.

16. A semiconductor device of claim 13, further comprising a plurality of low-voltage devices formed on said substrate outside the surface voltage sustaining structure.

17. A semiconductor device of claim 14, further comprising a plurality of low-voltage devices formed in a tub having a potential being the same as the floating voltage terminal wherein said tub is formed in a zone having largest doping density of the first conductivity type of the first surface voltage sustaining region of the surface voltage sustaining structure.

18. A semiconductor device of claim 14, further comprising a plurality of low-voltage devices formed on said substrate outside the surface voltage sustaining structure.

19. A semiconductor device of claim 15, further comprising a plurality of low-voltage devices formed on said substrate outside the surface voltage sustaining structure.

20. A semiconductor device of claim 17, further comprising a plurality of low-voltage devices which are formed on said substrate outside the surface voltage sustaining structure.

* * * * *